(12) United States Patent
Li

(10) Patent No.: US 6,259,643 B1
(45) Date of Patent: Jul. 10, 2001

(54) SINGLE EVENT UPSET (SEU) HARDENED STATIC RANDOM ACCESS MEMORY CELL

(75) Inventor: Bin Li, Fairfax, VA (US)

(73) Assignees: Systems Integration Inc.; BAE Systems Information and Electronic, both of Rockville, MD (US)

( * ) Notice: Subject to any disclaimer, the term of this patent is extended or adjusted under 35 U.S.C. 154(b) by 0 days.

(21) Appl. No.: 09/651,155

(22) Filed: Aug. 30, 2000

Related U.S. Application Data

(63) Continuation-in-part of application No. 09/441,942, filed on Nov. 17, 1999.
(60) Provisional application No. 60/136,479, filed on May 28, 1999.

(51) Int. Cl.[7] .................................................. G11C 7/02
(52) U.S. Cl. ............................ 365/206; 365/194; 365/76
(58) Field of Search ..................................... 365/154, 194, 365/206, 63, 72, 76

(56) References Cited

U.S. PATENT DOCUMENTS

| | | | |
|---|---|---|---|
| 4,716,320 | * | 12/1987 | McAdams .............................. 307/530 |
| 5,063,537 | * | 11/1991 | Akrout et al. ........................... 365/96 |
| 5,162,681 | * | 11/1992 | Lee ......................................... 307/530 |
| 5,631,863 | * | 5/1997 | Fechner et al. ....................... 365/156 |
| 5,764,572 | * | 6/1998 | Hammick ......................... 365/189.01 |

* cited by examiner

*Primary Examiner*—David Nelms
*Assistant Examiner*—Thong Le
(74) *Attorney, Agent, or Firm*—Antony P. Ng; Bracewell & Patterson, L.L.P.

(57) ABSTRACT

A single event effect hardening technique for removing glitches in digital logic circuits is disclosed. The noise immune latch circuit includes a first input, a second input, and an output. The noise immune latch circuit includes a first set of two cross-coupled transistors, a second set of two cross-coupled transistors, a first set of isolation transistors, and a second set of isolation transistors. The cross-coupling is accomplished by connecting a gate of each transistor to a drain of another transistor in a same set. The first and second sets of isolation transistors are respectively connected to the first and second sets of cross-coupled transistors such that two inversion paths are formed including the two sets of cross-coupled transistors and the two sets of isolation transistors. The noise immune latch circuit changes from one state to another state only upon having incoming input signals of identical polarity being applied contemporaneously at both the first input and the second input. In addition, a delay element is connected between the incoming signals and the second input. The delay element provides a signal delay time equal to or greater than a pulse width of a noise induced glitch but less than a pre-determined pulse width of an incoming signal under normal operation.

20 Claims, 9 Drawing Sheets

SINGLE EVENT UPSET (SEU) HARDENED STATIC RANDOM ACCESS MEMORY CELL

CROSS REFERENCE TO RELATED PATENTS

The present application is a continuation-in-part of an allowed application, Ser. No. 09/441,942, filed on Nov. 17, 1999, the contents of which are incorporated by reference herein which claims benefit of Provisional No. 60/136,479 filed May 28, 1999.

BACKGROUND OF THE INVENTION

1. Technical Field

The present invention relates to integrated circuits in general, and in particular to bi-stable integrated circuits. Still more particularly, the present invention relates to a circuit for filtering single event effect induced glitches.

2. Description of the Prior Art

In certain environments, such as satellite orbital space, in which the level of radiation is relatively intense, electronic devices that utilize static random access memories (SRAMs) are more susceptible to single event upsets (SEUs) or soft errors. These SEUs are typically caused by electron-hole pairs created by, and travelling along the path of, a single energetic particle as it passes through the memory cells of the SRAMs. Should the energetic particle generate a critical charge within a storage node of an SRAM cell, the logic state of the SRAM cell will be upset. Thus, the critical charge is the minimum amount of electrical charge required to change the logic state of the SRAM cell.

Referring now to the drawings and in particular to FIG. 1, there is illustrated a schematic diagram of a conventional memory cell that is typically used in SRAMs. Memory cell 10 is constructed with two cross-coupled complementary metal oxide semiconductor (CMOS) inverters 17 and 18. As shown, inverter 17 includes a p-channel transistor 11 and an n-channel transistor 12, and inverter 18 includes a p-channel transistor 13 and an n-channel transistor 14. The gates of transistors 11 and 12 are connected to the drains of transistors 13 and 14, and the gates of transistors 13 and 14 are connected to the drains of transistors 11 and 12. This arrangement of inverter 17 and inverter 18 is commonly referred to as cross-coupled inverters, and the two lines connecting the gates and the drains of inverters 17 and 18 are commonly referred to as cross-coupling lines. An n-channel pass transistor 15, having its gate connected to a wordline WL, is coupled between a bit line BL and a node S1. Similarly, an n-channel pass transistor 16, also having its gate connected to wordline WL, is coupled between a bit line $\overline{BL}$ and a node S2. When enabled, pass transistors 15, 16 allow data to pass in and out of memory cell 10 from bit lines BL and $\overline{BL}$, respectively. Pass transistors 15, 16 are enabled by wordline WL, which has a state that is a function of the row address within an SRAM. The row address is decoded by a row decoder (not shown) within the SRAM such that only one out of n wordlines is enabled, where n is the total number of rows of memory cells in the SRAM.

During operation, the voltages of nodes S1 and S2 are logical complements of one another, due to the cross-coupling of inverters 17 and 18. When wordline WL is energized by the row decoder according to the row address received, pass transistors 15 and 16 will be turned on, coupling nodes S1 and S2 to bit lines BL and $\overline{BL}$, respectively. Accordingly, when wordline WL is high, the state of memory cell 10 can establish a differential voltage on BL and $\overline{BL}$.

The logic state of memory cell 10 can be changed by an SEU in many ways. For example, if a single energetic particle, such as a proton particle, strikes the drain of p-channel transistor 11 of inverter 17, electrons will diffuse towards a power supply $V_{dd}$ of inverter 17, and holes collected at the drain such that the current flows through the PN junction will change the output voltage of inverter 17 at node S1 from a logic low to a logic high when n-channel transistor 12 is on and p-channel transistor 11 is off. However, if the proton particle strikes the drain of n-channel transistor 12 of inverter 17, holes will drift towards ground, and electrons collected at the drain such that the current flows through the PN junction will change the output voltage of inverter 17 at node S1 from a logic high to a logic low when p-channel transistor 11 is on and n-channel transistor 12 is off.

According to the prior art, one method of hardening a memory cell, such as memory cell 10, against SEU is by reducing the amount of charges generated by a given particle strike. This is typically accomplished by using a silicon film thinner than the collection depth in bulk semiconductor. For example, an SRAM cell created on a thin film on an insulator, such as silicon on insulator (SOI), is much less susceptible to SEUs than an SRAM cell created on a bulk silicon because ionization charge along a path in an insulator is more likely to recombine than to be collected compared to ionization charge created in a bulk silicon. However, the processing cost of SOI is much higher than bulk silicon; thus, SOI is generally not the most preferable method. But as the number and density of memory cells and logic circuits within an integrated circuit device have rapidly grown over the years, SEU error rate has become an alarming problem that cannot be ignored, even for application environments in which the level of radiation is relatively low.

Another way to reduce the susceptibility of a memory cell, such as memory cell 10, to SEUs is by increasing the RC time constant of the memory cell. With reference now to FIG. 2, there is illustrated a schematic diagram of an SEU-hardened SRAM cell using a resistive approach, in accordance with the prior art. The SEU hardening scheme for SRAM cell 20 is based on increasing the RC time constant required to produce SEU immunity, and that is accomplished by increasing the resistance of the cross-coupling lines of the cross-coupled inverters from FIG. 1. FIG. 2 illustrates the same circuit as shown in FIG. 1 with the exception that resistors R1 and R2 are included in the cross-coupling lines of inverters 17 and 18. The purpose of resistors R1 and R2 is to increase the RC time constant delay associated with the gate capacitances of transistors 11–14. The initial effect of an energetic particle strike to a node of SRAM cell 20, say node S1, is to change the voltage of node S1. Upset will occur if this voltage change propagates through the cross-coupling of inverters 17 and 18 before the initial voltage of node S1 can be restored. The increased RC delay can slow the feedback propagation through the cross-coupling and allows more time for recovery of the initially affected node S1. But this increase in RC propagation delay also slows the write cycle time of SRAM cell 20. Because the write cycle of SRAMs has typically been faster than the read cycle, some slowing of the write cycle has been viewed as acceptable, especially since the read cycle time is usually more performance critical. However, as memory cells are scaled to smaller geometries, the speed of the write cycle of SRAM cells becomes more critical than in previous SRAM designs. In addition, it is very difficult to control process parameters under the resistive approach. As a result, the resistive approach to SEU hardening is no longer desirable for SRAMs.

Yet another way to reduce the susceptibility of a memory cell to SEU is to increase the capacitance on the drains of inverters 17 and 18 of memory cell 10 from FIG. 1, thus decreasing the voltage change on a node for a given amount of collected charge. Referring now to FIG. 3, there is illustrated a schematic diagram of an SEU-hardened SRAM cell using a capacitive approach in accordance with the prior art. FIG. 3 illustrates the same circuit as shown in FIG. 1 with the exception that a capacitor C is connected across the drains of inverters 17 and 18. By having capacitor C located between the gate and drain of inverters 17 and 18, the effective capacitance is increased by the Miller effect. Also, with capacitor C connected between the gate and drain, a change in the drain voltage will induce a change in the gate voltage such that restoring current is increased. Furthermore, the increased capacitance on the gate will increase the RC delay in the feedback path, thus increasing the resistance to SEUs as well as retarding changes in logic state. However, the capacitive approach to SEU hardening is not very practical because it slows down the speed of the memory cell. Thus, it is desirable to provide an improved SEU hardened memory cell for SRAMs that can easily be fabricated with the conventional complementary metal oxide semiconductor (CMOS) technology.

SUMMARY OF THE INVENTION

In accordance with a preferred embodiment of the present invention, a single event upset hardened memory cell includes a first set of cross-coupled transistors, a second set of cross-coupled transistors, a first set of isolation transistors, and a second set of isolation transistors. The first and second sets of isolation transistors are coupled to the first and second set of cross-coupled transistors, respectively, such that two inversion paths are formed between the cross-coupled transistors and the isolation transistors.

The single event upset hardened memory cell can be modified to a single event effect immune latch, as described herein.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
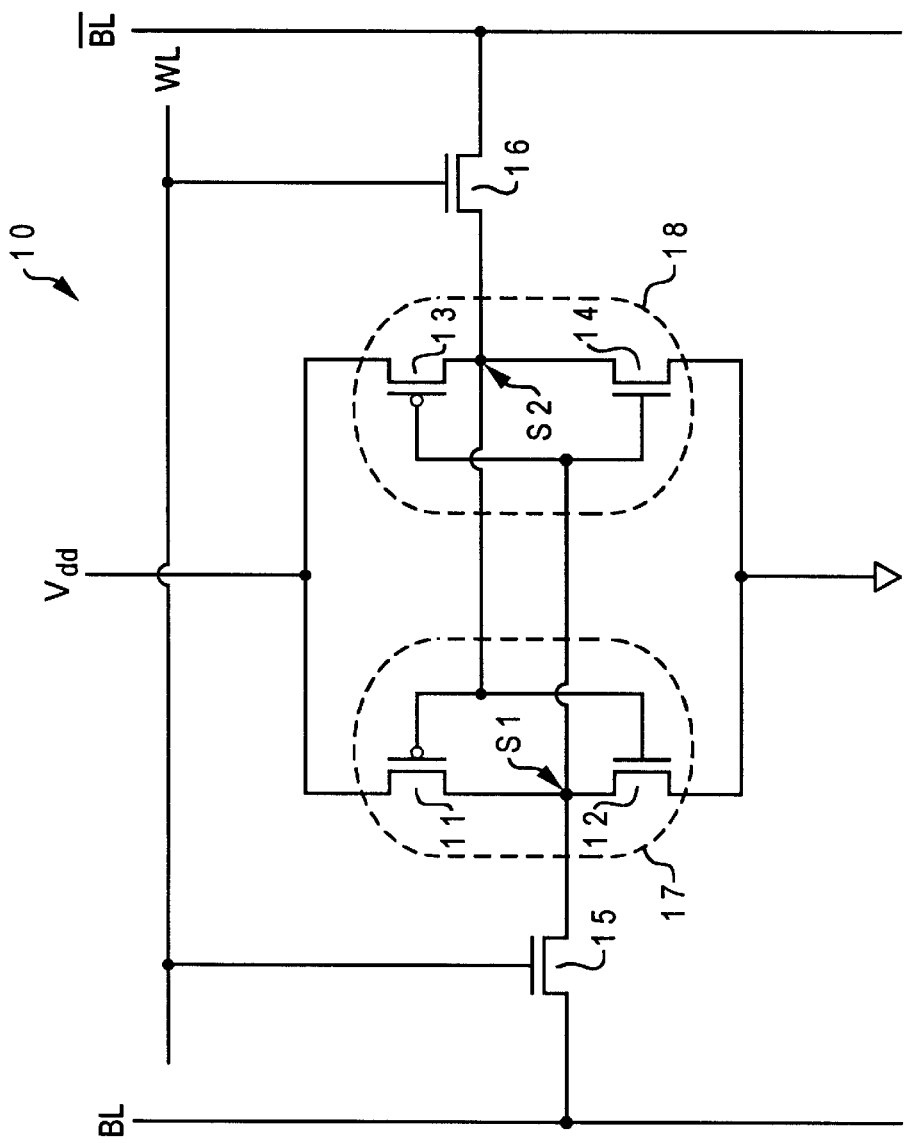
FIG. 1 is a schematic diagram of a conventional memory cell that is typically used in a static random access memory (SRAM)
Figure 2:
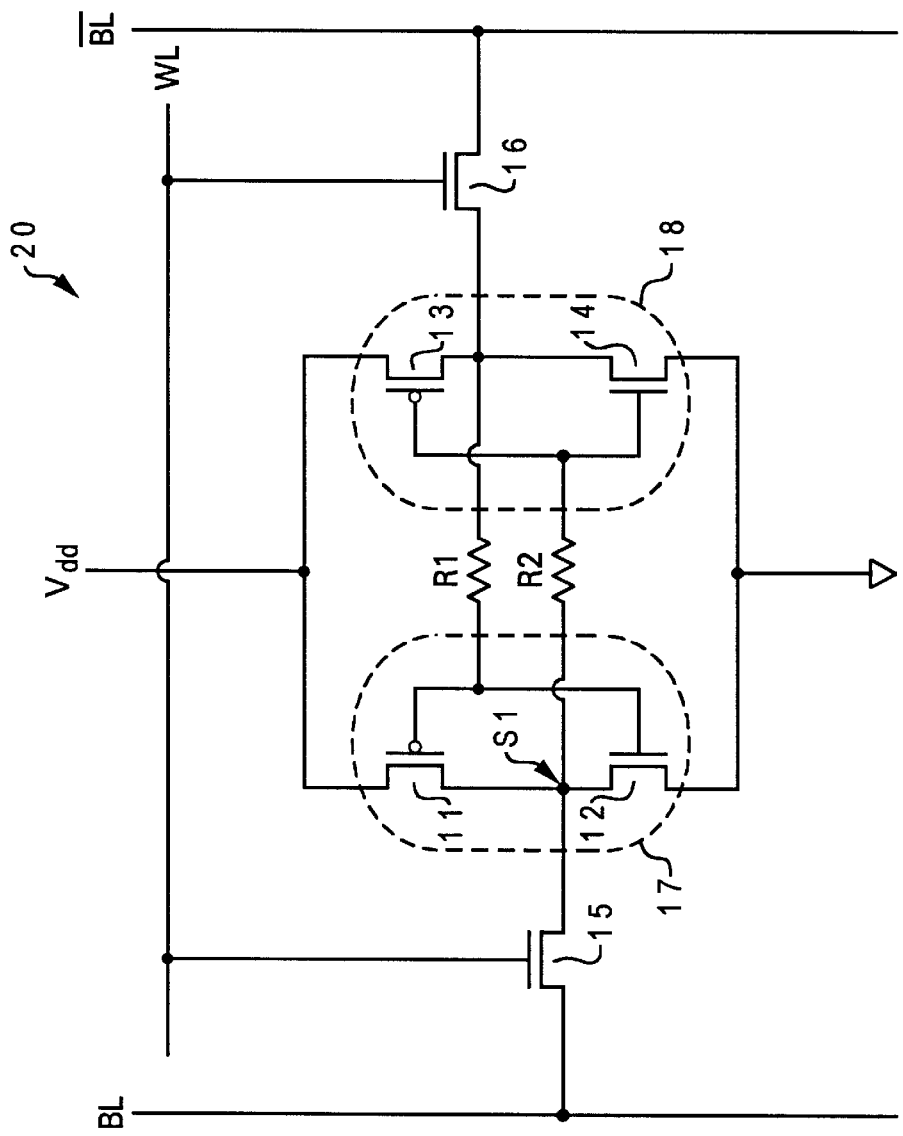
FIG. 2 is a schematic diagram of a single event upset (SEU) hardened SRAM cell using a resistive approach, in accordance with the prior art.
Figure 3:
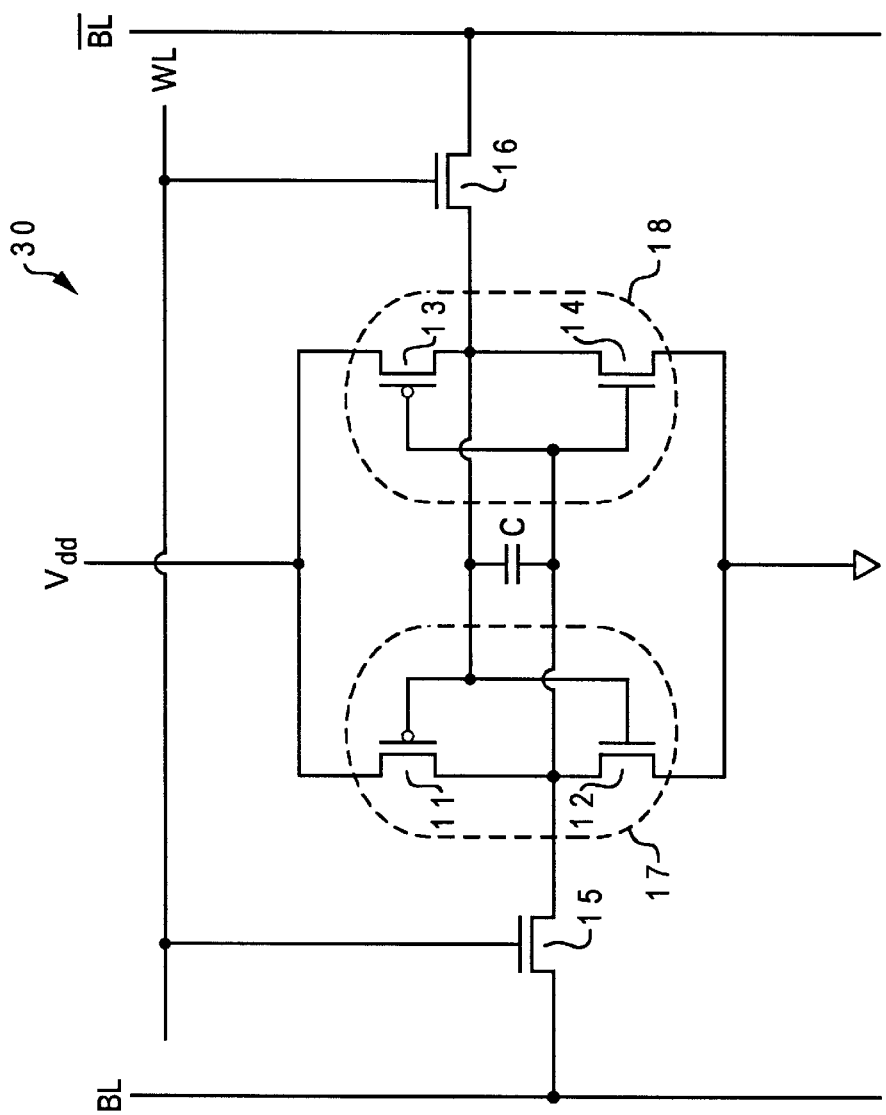
FIG. 3 is a schematic diagram of an SEU-hardened SRAM cell using a capacitive approach, in accordance with the prior art.
Figure 4:
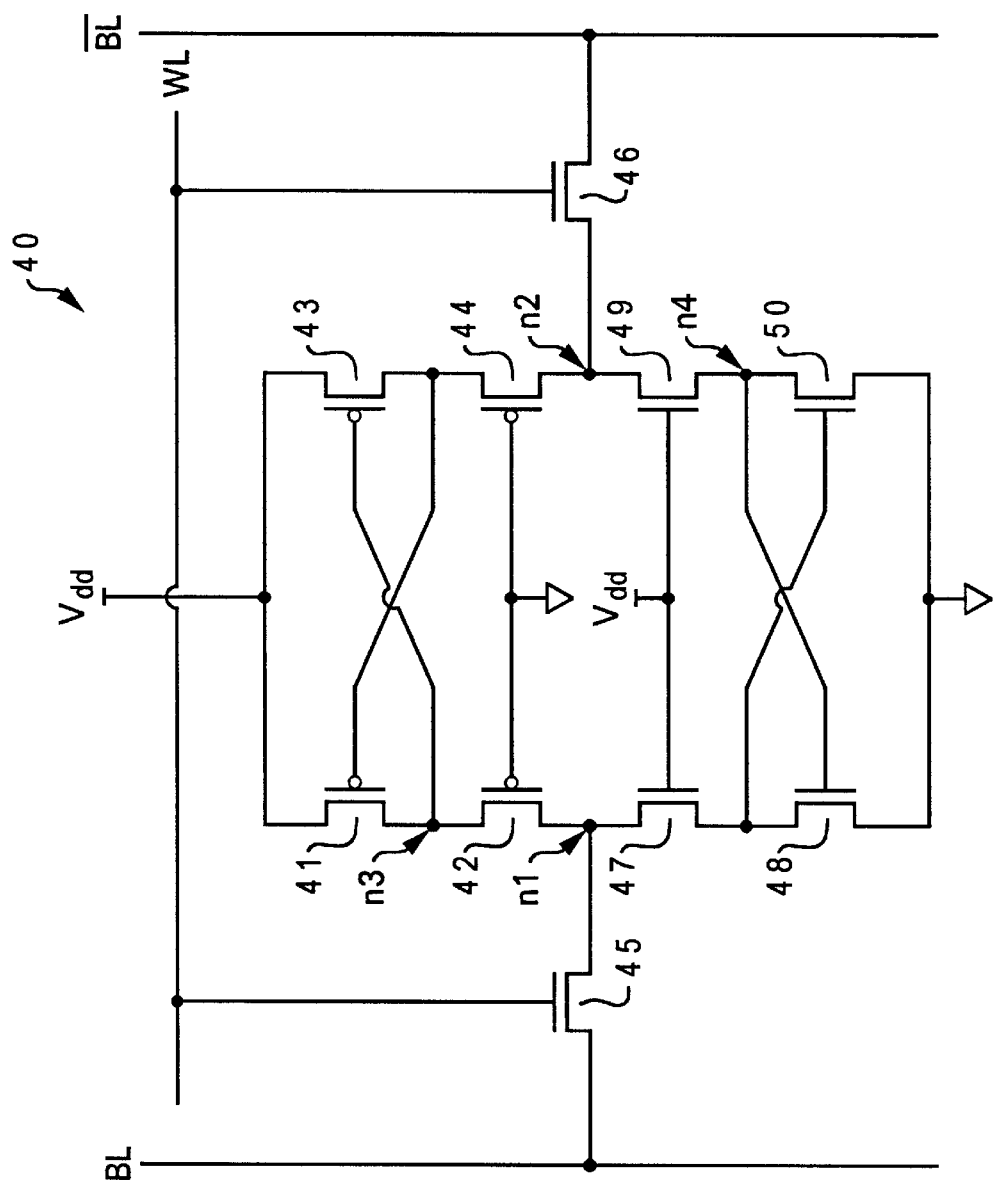
FIG. 4 is a schematic diagram of an SEU-hardened SRAM cell in accordance with a preferred embodiment of the present invention.

With reference now to FIG. 4, there is illustrated a schematic diagram of an SEU-hardened SRAM cell in accordance with a preferred embodiment of the present invention. As shown, an SRAM cell 40 includes p-channel transistors 41–44 and n-channel transistors 47–50. Transistors 41, 42, 47, and 48 are connected in series, with the source of transistor 41 connected to a power supply, $V_{dd}$, and transistor 48 connected to ground. Similarly, transistors 43, 44, 49, and 50 are connected in series, with the source of transistor 43 connected to $V_{dd}$ and transistor 50 connected to ground.

In addition, transistors 41, 42 are cross-coupled to transistors 43, 44, and transistors 47, 48 are cross-coupled to transistors 49, 50. For transistors 41–44, the cross-coupling is accomplished by connecting the gate of transistor 41 to a node between transistors 43 and 44, and by connecting the gate of transistor 43 to a node between transistors 41 and 42. For transistors 47–50, the cross-coupling is accomplished by connecting the gate of transistor 48 to a node between transistors 49 and 50, and by connecting the gate of transistor 50 to a node between transistors 47 and 48.

As a preferred embodiment of the present invention, the gates of transistors 42 and 44 are connected to a low voltage, such as ground; while the gates of transistors 47 and 49 are connected to a high voltage, such as a power supply $V_{dd}$. Thus, transistors 42 and 47 function as isolation transistors for transistors 41 and 48, respectively. Similarly, transistors 44 and 49 function as isolation transistors for transistors 43 and 50, respectively. As a result, two inversion paths are formed. The first inversion path includes transistors 41, 44, 49, and 48; and the second inversion path includes transistors 43, 42, 47, and 50.

Also shown in FIG. 4 is two n-channel pass transistors 45 and 46. Pass transistor 45, having its gate connected to a wordline WL, is coupled between a bit line BL and a node n1. Similarly, pass transistor 46, also having its gate connected to wordline WL, is coupled between a bit line $\overline{BL}$ and a node n2. When enabled, pass transistors 45, 46 allow data to pass in and out of SRAM cell 40 from bit lines BL and $\overline{BL}$, respectively. Pass transistors 45, 46 are enabled by wordline WL, which has a state that is a function of the row address in an SRAM, as is understood by those skilled in the relevant art.

During operation, the voltages of nodes n1 and n2 are logical complements of one another. When wordline WL is energized by the row decoder according to the row address received, pass transistors 45 and 46 will be turned on, coupling nodes n1 and n2 to bit lines BL and $\overline{BL}$, respectively. Accordingly, when wordline WL is high, the state of SRAM cell 40 can establish a differential voltage on BL and $\overline{BL}$. The sizes of transistors 41–44 and 47–50 are generally chosen such that when pass transistors 45 and 46 are turned on by wordline WL, a differentially low voltage at bit line BL with respect to bit line $\overline{BL}$ can force node n2 to a logic high state, and a differentially low voltage at bit line $\overline{BL}$ with respect to bit line BL can force node n1 to a logic high state. In addition, the sizes of transistors 41–44 and 47–50 are also chosen such that when pass transistors 45 and 46 are turned on by wordline WL, a differentially high voltage at bit line BL with respect to bit line $\overline{BL}$ will not force node n2 high, nor will a differentially high voltage at bit line $\overline{BL}$ with respect to bit line BL force node n1 high. Therefore, writing into SRAM cell 40 is accomplished by "pulling" the desired bit line and thus the desired side of SRAM cell 40 at either node n1 or node n2 low, which in turn (due to feedback paths in SRAM cell 40) causes the opposite side of SRAM cell 40 to have a logic high state.

The width-to-length ratios of transistors 42, 44 and 47, 49 are carefully chosen to assist in the protection against high energy particle upset. Transistors 42, 44 are much smaller in comparison to the cross-coupled transistors 41, 43. Thus, a significant amount of voltage can be dropped across each of transistors 42 and 44 with respect to cross-coupled transistors 41 and 43. In essence, transistors 42, 44 provides SEU immunity for cross-coupled transistors 41, 43 via voltage division between nodes n1, n2 and $V_{dd}$. Similarly, transistors 47, 49 are much smaller in comparison to the cross-coupled transistors 48, 50. Thus, a significant amount of voltage can be dropped across each of transistors 47 and 49 with respect to cross-coupled transistors 48 and 50. Transistors 47, 49 provides SEU immunity for cross-coupled transistors 48, 50 via voltage division between nodes n1, n2 and ground. As a result, the sensitive storage nodes of SRAM cell 40 are protected. The exact relative ratio between transistors 42, 44, 47, 49 and the remaining transistors depends on the supply voltage $V_{dd}$ and the threshold voltage of the transistors.

SRAM cell 40 is hardened from SEUs via two voltage divisions. A first voltage division is provided between isolation transistors 42, 44 and cross-coupled transistors 41, 43 during a particle strike by connecting isolation transistors 42, 44 and cross-coupled transistors 41, 43 between storage nodes n1, n2 and power supply $V_{dd}$. A second voltage division is provided between isolation transistors 47, 49 and cross-coupled transistors 48, 50 during a particle strike by connecting isolation transistors 47, 49 and cross-coupled transistors 48, 50 between storage nodes n1, n2 and ground.

Figure 5:
FIG. 5 is a graphical illustration of the simulation results of particle strikes on the SRAM cell from FIG. 4.

Referring now to FIG. 5, the simulation results of particle strikes on SRAM cell 40 from FIG. 4 are illustrated. During the simulation, four particle strike events ps1–ps4 separately occurred at node n1, node n2, node n3, and node n4 of SRAM cell 40. All four particle strike events ps1–ps4 occurred when wordline WL was not asserted because this is the time when SRAM cell 40 is most susceptible to SEUs caused by particle strikes. The simulation results indicates that during a particle strike at one node of SRAM cell 40, the complementary node is not affected by the particle strike. For example, node n2 maintains its state during particle strike event ps1 at node n1; and similarly, node n1 maintains its state during particle strike event ps2 at node n2. The simulation results further indicates that the effects on node n1 and node n2 during separate particle strike events at node n3 and node n4. For example, when a particle strikes at node n3, the effect is felt at node n1 in the form of particle strike event ps3, but node n2 maintains its state; and similarly, when a particle strikes at node n4, the effect is felt at node n2 in the form of particle strike event ps4, but node n1 maintains its state.

Figure 6:
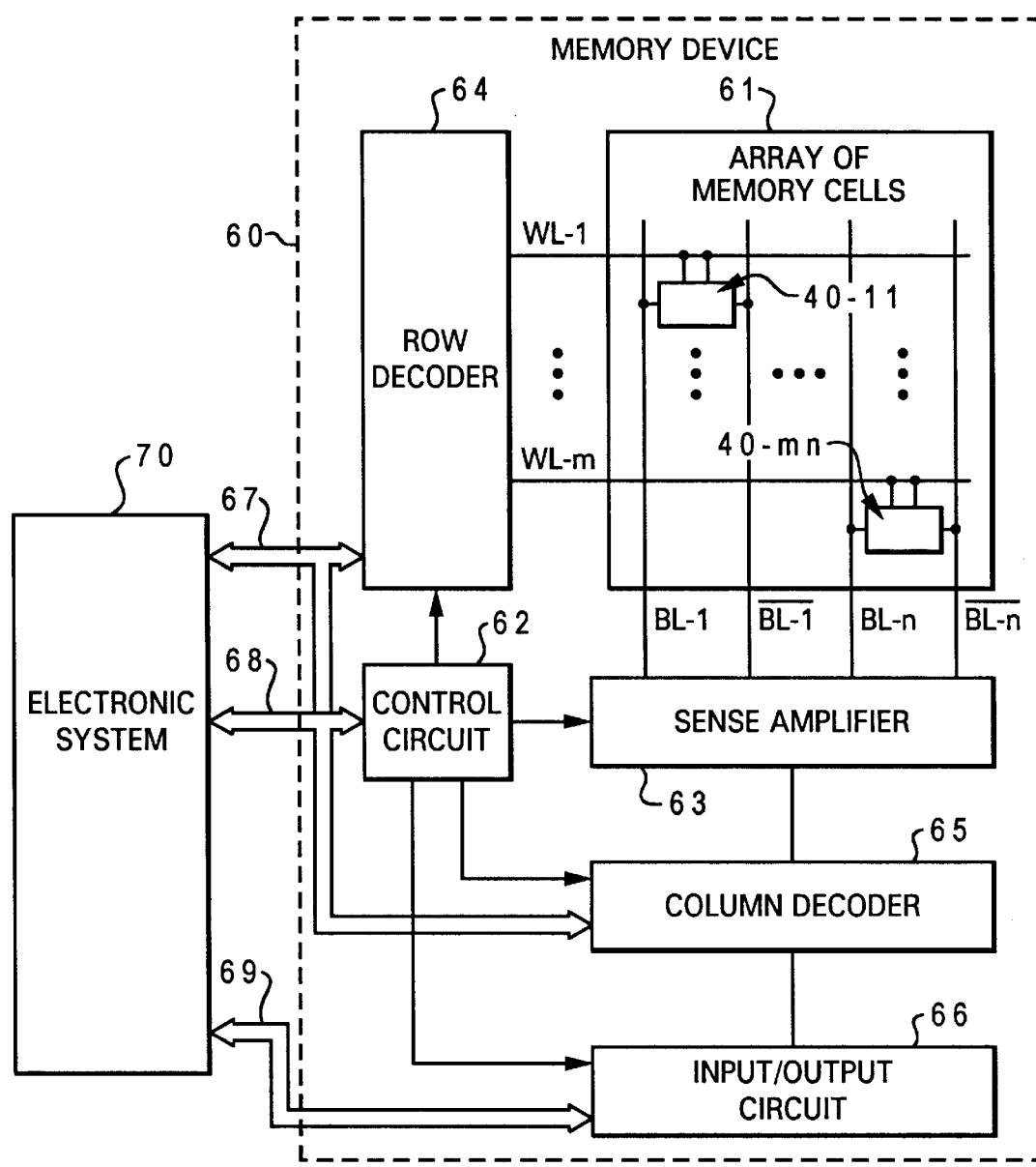
FIG. 6 is a block diagram of an apparatus in which a preferred embodiment of the present invention may be incorporated.

As has been described, the present invention provides a SEU-hardened memory cell to be utilized in SRAMs. The present invention may be implemented in a variety of apparatuses having an SRAM. For example, with reference now to FIG. 6, there is depicted a block diagram of an apparatus in which a preferred embodiment of the present invention may be incorporated. As shown, the apparatus includes an electronic system 70 coupled to a memory device 60. Electronic system 70 may be, for example, a processor, a memory controller, a chip set or any system that stores data in a memory device such as memory device 60. Electronic system 70 is coupled to a row decoder 64 and a column decoder 65 of memory device 60 via address lines 67. Electronic system 70 is also coupled to a control circuit 62 of memory device 60 via control lines 68. In addition, electronic system 70 is coupled to an input/output circuit 66 of memory device 60 via input/output lines 69.

Memory device 60 includes a sense amplifier 63 and a memory cell array 61. Array 61 includes a number of wordlines, WL-1 through WL-m, and a number of bit line pairs, BL-1 through BL-n (and $\overline{BL}$-1 through $\overline{BL}$-n). Array 61 is constructed to use a memory cell sensing scheme such that each bit line pair is to be used in reading and writing data into a SRAM cell such as SRAM cell 40-11. Memory device 60 is controlled by control circuit 62. Control circuit 62 is coupled to row decoder 64, column decoder 65, input/output circuit 66, and sense amplifier 63.

Memory device 60 reads and writes data for electronic system 70. For example, in order to read a value from SRAM cell 40-11 in a read operation, electronic system 70 provides the address of SRAM cell 40-11 to row decoder 64 over address lines 67. Electronic system 70 also provides control signals to control circuit 62 over control lines 68. Control circuit 62 provides signals to sense amplifier 63 that causes an equilibrate circuit (not shown) within sense amplifier 63 to equilibrate the voltages on bit lines BL-1 and $\overline{BL}$-1. The equilibrate circuit of sense amplifier 63 forces bit lines BL-1 and $\overline{BL}$-1 to a common voltage; for example, $V_{dd}$-$V_t$. It is noted that the voltage range between the high and low logic levels for sense amplifier 63 differs from that of SRAM cell 40-11.

With the charge on bit line pair, sense amplifier 63 next detects the logic state of SRAM cell 40-11. Column decoder 65 receives the column address of the selected cell from electronic system 70. Column decoder 65 identifies the appropriate bit line pair for sense amplifier 63 to use in reading the value from SRAM cell 40-11. Sense amplifier 63 senses and amplifies the differential voltage across the bit line pair and thus produces high and low logic levels on complementary nodes of sense amplifier 63 that correspond to the states of sensed bit line pair. These voltage levels are passed to electronic system 70 by input/output circuit 66 via input/output lines 69.

In a write operation, electronic system 70 provides data to be written to, for example, SRAM cell 40-11 over input/output lines 69 to input/output circuit 67. Column decoder 65 receives the column address from electronic system 70 via address lines 67 to select the appropriate bit line pair for the selected SRAM cell. Sense amplifier 63, under the control of control circuit 62, forces the bit line pair for SRAM cell 40-11 to complementary high and low logic levels based on the data to be stored in SRAM cell 40-11. Row decoder 64 receives an address from electronic system 70 over address line 67 that indicates the appropriate wordline to activate for this store operation. In this process, the high and low logic levels for sense amplifier 63 are translated to appropriate voltage levels for SRAM cell 40-11.

Single event upset hardened memory cell 40 in FIG. 4 can be modified to a single event effect immune latch, as described herebelow.

Figure 7:
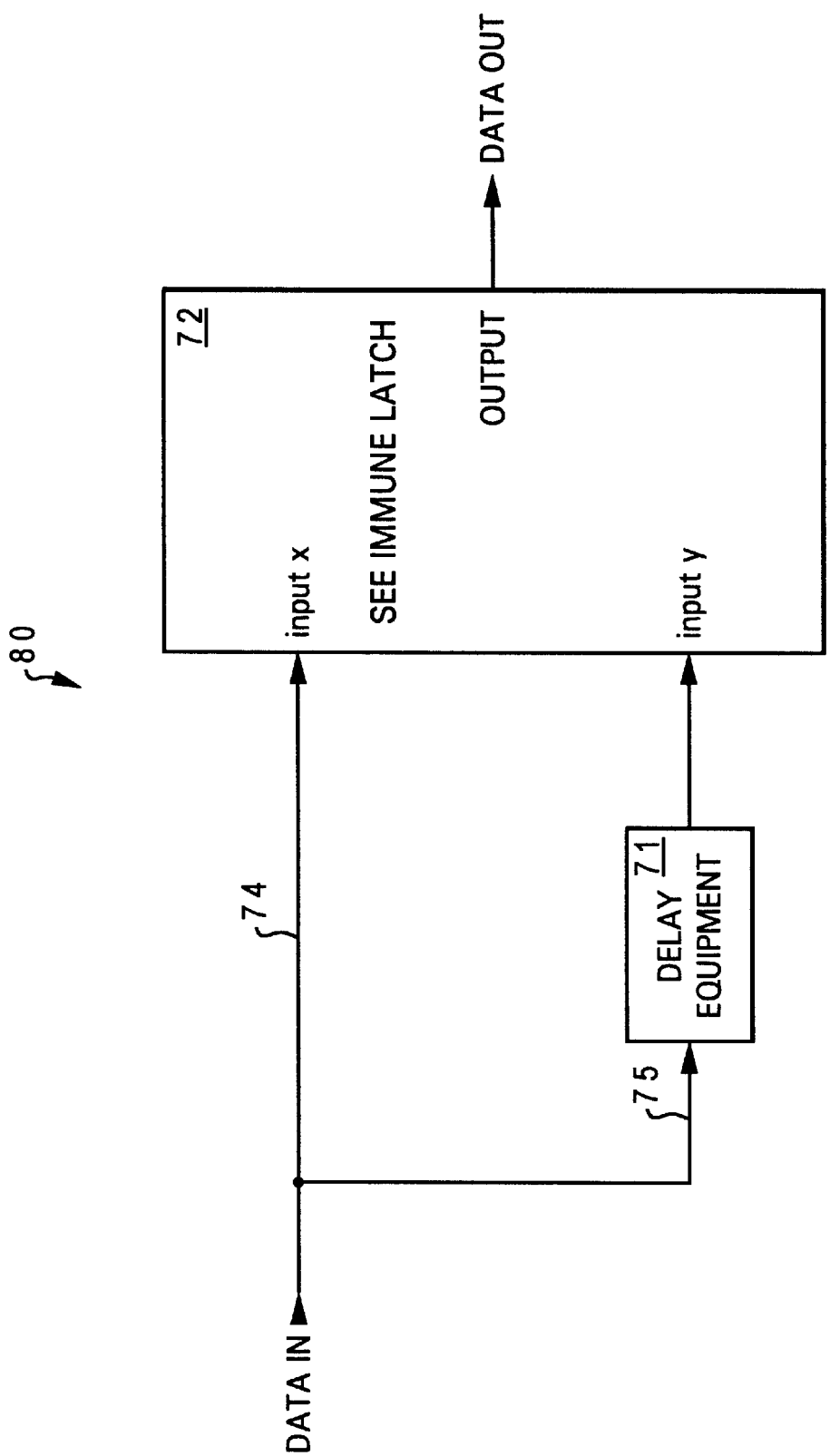
FIG. 7 is a block diagram of a circuit for filtering single event effect (SEE) induced glitches, in accordance with a preferred embodiment of the present invention.

Referring now to FIG. 7, there is illustrated a block diagram of a circuit for filtering single event effect (SEE) induced glitches, in accordance with a preferred embodiment of the present invention. As shown, a filter circuit 80 includes a delay element 71 and an SEE immune latch 72. SEE immune latch 72 includes an input x, an input y, and an output. A DATA IN signal input is preferably divided into two signal paths, namely, a non-delayed signal path 74 and a delayed signal path 75. Non-delay signal path 74 is directly connected to input x of SEE immune latch 72, and delay signal path 75 is connected to input y of SEE immune latch 72 via delay element 71.

An important characteristic of SEE immune latch 72 is that the state of SEE immune latch 72 only changes when signals on both input x and input y have the same polarity. In addition, the delay time of delay element 71 is adjusted such that a glitch or transient disturbance occurred at DATA IN signal input does not appear at both input x and input y simultaneously. In other words, when an SEE induced glitch occurs at the DATA IN input, the SEE induced glitch will arrive at input x and input y at a different time because the propagation time is different between non-delayed signal path 74 and delayed signal path 75. As a result, the state of SEE immune latch 72 remains the same even after an SEE induced glitch. Thus, in conjunction with delay element 71, SEE immune latch 72 allows filter circuit 70 to filter out any SEE induced glitches occurred at DATA IN signal input.

It is important to provide an appropriate delay time for delay element 71. In order to achieve the best result, the delay time for delay element 71 is preferably set to equal to or greater than the pulse width of an SEE induced glitch but less than the pre-determined pulse width of a signal under normal operation.

Figure 8:
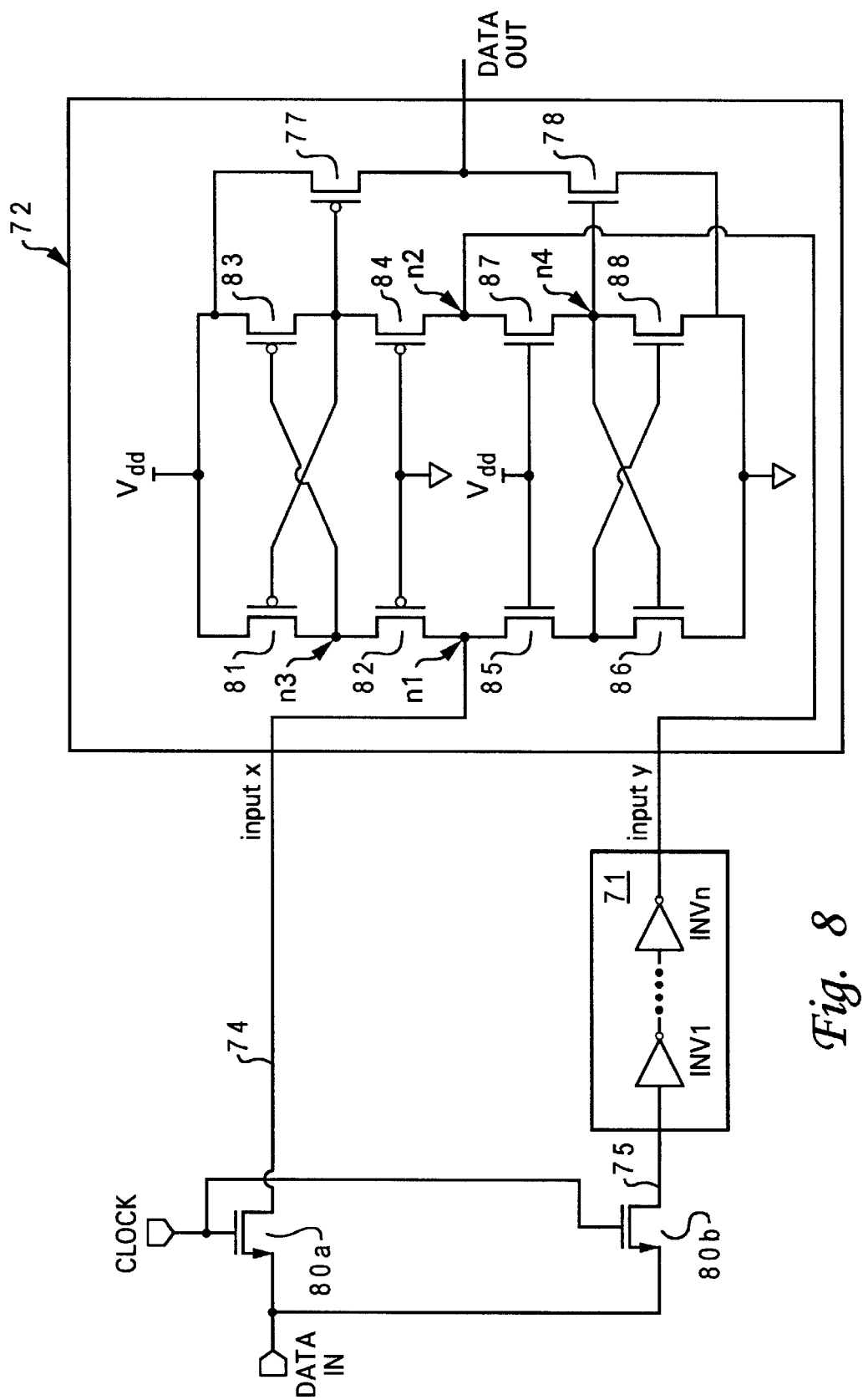
FIG. 8 is a schematic circuit diagram of the filter circuit from FIG. 7, in accordance with a preferred embodiment of the present invention.

With reference now to FIG. 8, there is illustrated a schematic circuit diagram of filter circuit 80 from FIG. 7, in accordance with a preferred embodiment of the present invention. As shown, SEE immune latch 72 includes p-channel transistors 77, 81–84 and n-channel transistors 78, 85–82. Transistors 81, 82, 85, and 86 are connected in series, with the source of transistor 81 connected to a power supply, $V_{dd}$, and transistor 86 connected to ground. Similarly, transistors 83, 84, 87, and 88 are connected in series, with the source of transistor 83 connected to $V_{dd}$ and transistor 88 connected to ground.

In addition, transistors 81, 82 are cross-coupled to transistors 83, 84, and transistors 85, 86 are cross-coupled to transistors 87, 88. For transistors 81–84, the cross-coupling is accomplished by connecting the gate of transistor 81 to a node between transistors 83 and 84, and by connecting the gate of transistor 83 to a node between transistors 81 and 82. For transistors 85–88, the cross-coupling is accomplished by connecting the gate of transistor 86 to a node between transistors 87 and 88, and by connecting the gate of transistor 88 to a node between transistors 85 and 86.

The gates of transistors 82 and 84 are connected to a low voltage, such as ground; while the gates of transistors 85 and 87 are connected to a high voltage, such as a power supply $V_{dd}$. Thus, transistors 82 and 85 function as isolation transistors for transistors 81 and 86, respectively. Similarly, transistors 84 and 87 function as isolation transistors for transistors 83 and 88, respectively. As a result, two inversion paths are formed. The first inversion path includes transistors 81, 84, 87, and 86; and the second inversion path includes transistors 83, 82, 85, and 88.

During operation, the voltages at nodes n1 and n2 are logical complements of one another, and transistors 77, 78 generates an output signal at DATA OUT.

The width-to-length ratios of transistors 82, 84 and 85, 87 are carefully chosen to assist in the protection against high energy particle upset. Transistors 82, 84 are much smaller in comparison to the cross-coupled transistors 81, 83. Thus, a significant amount of voltage can be dropped across each of transistors 82 and 84 with respect to cross-coupled transistors 81 and 83. In essence, transistors 82, 84 provides SEE immunity for cross-coupled transistors 81, 83 via voltage division between nodes n1, n3 and $V_{dd}$. Similarly, transistors 85, 87 are much smaller in comparison to the cross-coupled transistors 86, 88. Thus, a significant amount of voltage can be dropped across each of transistors 85 and 87 with respect to cross-coupled transistors 86 and 88. Transistors 85, 87 provides SEE immunity for cross-coupled transistors 86, 88 via voltage division between nodes n2, n4 and ground. As a result, the sensitive storage nodes of SEE immune latch 72 are protected. The exact relative ratio between transistors 82, 84, 85, 87 and the remaining transistors depends on the supply voltage $V_{dd}$ and the threshold voltage of the transistors.

As shown in FIG. 8, a single DATA IN signal input is divided into non-delayed signal path 74 and delayed signal path 75. Both non-delayed signal path 74 and delayed signal path 75 are controlled by a clock via n-channel transistors 80a and 80b, respectively. For non-delayed signal path 74, DATA IN input signals are fed directly (via transistor 80a) into input x of SEE immune latch 72. For delayed signal path 75, DATA IN input signals are fed into input y of SEE immune latch 72 via delay element 71. In this implementation, delay element 71 includes several inverters, INV1 to INVn, where n is an odd number, connected in series. The number of inverters is preferably determined by the width of SEE induced glitches.

As mentioned previously, SEE immune latch 72 only changes state upon having same input signals being applied contemporaneously at input x and input y. If an SEE induced glitch occurs at the DATA IN signal input, the glitch will arrive at input x and input y of SEE immune latch 72 at a different time because the glitch on delayed signal path 75 takes longer to reach input y than the glitch on non-delayed signal path 74 to reach input x. As a result, the SEE induced glitch is filtered out because the state of SEE immune latch 72 remains the same after the SEE.

Figure 9:
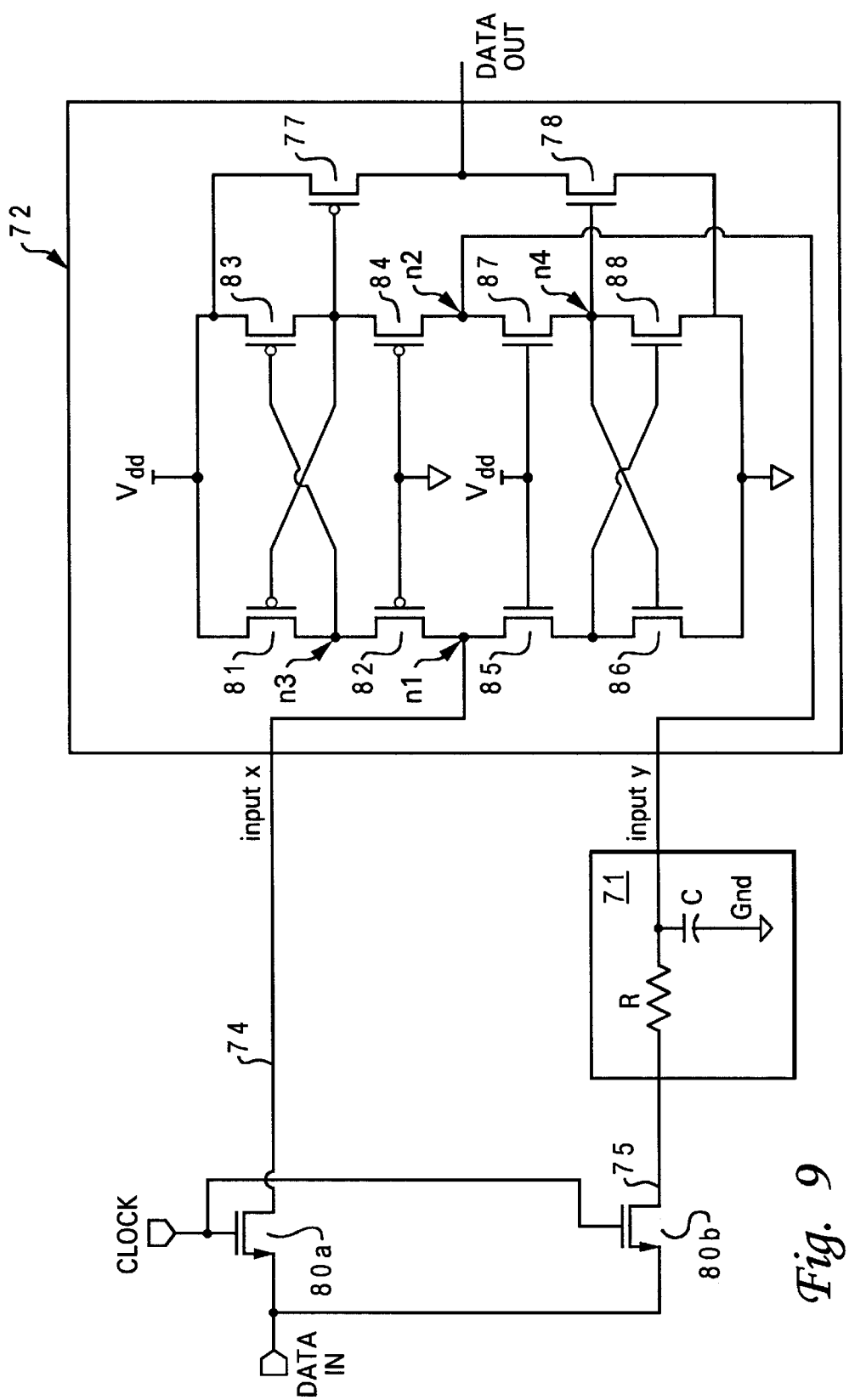
FIG. 9 is a schematic circuit diagram of the filter circuit from FIG. 7, in accordance with an alternative embodiment of the present invention.

Referring now to FIG. 9, there is illustrated a schematic circuit diagram of filter circuit 70 from FIG. 7, in accordance with an alternative embodiment of the present invention. As shown, SEE immune latch 72 includes p-channel transistors 77, 81–84 and n-channel transistors 78, 85–88, arranged in the same configuration as shown in FIG. 8. However, in this embodiment, delay element 71 is implemented with a resistor R and a capacitor C connected in a low-pass filter configuration. Again, if an SEE induced glitch occurs at the DATA IN input, the glitch will arrive at input x and input y of SEE immune latch 72 at a different time because the glitch on delayed signal path 75 takes longer to reach input y than the glitch on non-delayed signal path 74 to reach input x. As a result, the SEE induced glitch is filtered out because the state of SEE immune latch 72 remains the same after the SEE.

As has been described, the present invention provides a circuit for filtering SEE induced glitches. With the present invention, any SEE induced glitches can be eliminated from a data bus and/or an address bus of a digital logic circuit such as memory device 60 shown in FIG. 6. In FIG. 7, although delay element 71 is shown to be placed between clock-controlled transistor 80b and input y, delay element 71 can also be placed between the DATA IN input and clock-controlled transistor 80*b*. By applying delay element 71 to the DATA IN signal input, a temporal separation greater than the duration of a single event effect generated glitch can be achieved on the data being driven into inputs x and y in this implementation, whereby single event effect pulses will not be written into SEE immune latch 72.

While the invention has been particularly shown and described with reference to a preferred embodiment, it will be understood by those skilled in the art that various changes in form and detail may be made therein without departing from the spirit and scope of the invention.

What is claimed is:

1. A filter circuit for filtering noise induced glitches, said filter circuit comprising:
   a noise immune latch circuit having a first input, a second input, and an output, wherein said noise immune latch circuit changes from one state to another state only upon having incoming input signals of identical polarity being applied contemporaneously at both said first input and said second input, wherein said noise immune latch circuit includes
      a first set of two cross-coupled transistors and a second set of two cross-coupled transistors, wherein said cross-coupling is accomplished by connecting a gate of each transistor to a drain of another transistor in a same set; and
      a first set of isolation transistors and a second set of isolation transistors, wherein said first and second sets of isolation transistors are respectively connected to said first and second sets of cross-coupled transistors such that two inversion paths are formed including said two sets of cross-coupled transistors and said two sets of isolation transistors; and
   a delay element connected between said incoming signals and said second input, wherein said delay element provides a signal delay time equal to or greater than a pulse width of a noise induced glitch but less than a pre-determined pulse width of an incoming signal under normal operation.

2. The filter circuit according to claim 1, wherein said delay element includes a plurality of inverters connected in series.

3. The filter circuit according to claim 1, wherein said delay element includes a resistor and a capacitor connected in a low-pass filter configuration.

4. The filter circuit according to claim 1, wherein said noise immune latch circuit includes a plurality of transistors connected in a cross-coupled configuration.

5. The filter circuit according to claim 1, wherein said first set of cross-coupled transistors includes two p-channel transistors.

6. The filter circuit according to claim 1, wherein said second set of cross-coupled transistors includes two n-channel transistors.

7. The filter circuit according to claim 1, wherein said first set of isolation transistors includes two p-channel transistors having their gate connected to a low voltage.

8. The filter circuit according to claim 7, wherein said low voltage is ground.

9. The filter circuit according to claim 1, wherein said second set of isolation transistors includes two n-channel transistors having their gate connected to a high voltage.

10. The filter circuit according to claim 9, wherein said high voltage is a voltage from a power supply.

11. An integrated circuit comprising:
    circuitry operative in response to a clock signal having transitions, wherein said circuitry includes a plurality of buses that are potentially subject to noise induced glitches; and
    a filter circuit inserted with each of said plurality of buses, wherein said filter circuit includes:
       a noise immune latch circuit having a first input, a second input, and an output, wherein said noise immune latch circuit changes from one state to another state only upon having incoming input signals of identical polarity being applied contemporaneously at both said first input and said second input, wherein said noise immune latch circuit includes
          a first set of two cross-coupled transistors and a second set of two cross-coupled transistors, wherein said cross-coupling is accomplished by connecting a gate of each transistor to a drain of another transistor in a same set; and
          a first set of isolation transistors and a second set of isolation transistors, wherein said first and second sets of isolation transistors are respectively connected to said first and second sets of cross-coupled transistors such that two inversion paths are formed including said two sets of cross-coupled transistors and said two sets of isolation transistors; and
       a delay element connected between said incoming signals and said second input, wherein said delay element provides a signal delay time equal to or greater than a pulse width of a noise induced glitch but less than a pre-determined pulse width of an incoming signal under normal operation.

12. The integrated circuit according to claim 11, wherein said delay element includes a plurality of inverters connected in series.

13. The integrated circuit according to claim 11, wherein said delay element includes a resistor and a capacitor connected in a low-pass integrated configuration.

14. The integrated circuit according to claim 11, wherein said noise immune latch circuit includes a plurality of transistors connected in a cross-coupled configuration.

15. The integrated circuit according to claim 11, wherein said first set of cross-coupled transistors includes two p-channel transistors.

16. The integrated circuit according to claim 11, wherein said second set of cross-coupled transistors includes two n-channel transistors.

17. The integrated circuit according to claim 11, wherein said first set of isolation transistors includes two p-channel transistors having their gate connected to a low voltage.

18. The integrated circuit according to claim 17, wherein said low voltage is ground.

19. The integrated circuit according to claim 11, wherein said second set of isolation transistors includes two n-channel transistors having their gate connected to a high voltage.

20. The integrated circuit according to claim 19, wherein said high voltage is a voltage from a power supply.

* * * * *